(12) United States Patent
Hennessy

(10) Patent No.: US 6,836,112 B2
(45) Date of Patent: Dec. 28, 2004

(54) CANTILEVER-FREE MAGNETIC RESONANCE FORCE MICROSCOPE

(76) Inventor: Michael J. Hennessy, 9 Patroon Pl., Ballston Lake, NY (US) 12019

(*) Notice: Subject to any disclaimer, the term of this patent is extended or adjusted under 35 U.S.C. 154(b) by 0 days.

(21) Appl. No.: 10/414,997

(22) Filed: Apr. 16, 2003

(65) Prior Publication Data

US 2004/0056657 A1 Mar. 25, 2004

Related U.S. Application Data

(60) Provisional application No. 60/373,178, filed on Apr. 17, 2002.

(51) Int. Cl.[7] .................................................. G01V 3/00
(52) U.S. Cl. ....................................................... 324/300
(58) Field of Search ................................ 324/300–302, 324/307, 309, 318–321; 600/410; 204/192.2; 73/105

(56) References Cited

U.S. PATENT DOCUMENTS

| | | | | |
|---|---|---|---|---|
| 3,742,212 A | * | 6/1973 | McIver, Jr. ................. | 250/286 |
| 4,105,917 A | * | 8/1978 | McIver et al. ............. | 250/291 |
| 5,619,139 A | * | 4/1997 | Holczer et al. ............ | 324/318 |
| 6,181,131 B1 | * | 1/2001 | Bruland et al. ............ | 324/300 |
| 6,683,451 B1 | * | 1/2004 | Moore et al. .............. | 324/218 |
| 2003/0006852 A1 | * | 1/2003 | Weitekamp ................ | 331/154 |
| 2003/0193333 A1 | * | 10/2003 | Barbic ....................... | 324/300 |

* cited by examiner

Primary Examiner—Diego Gutierrez
Assistant Examiner—Dixomara Vargas
(74) Attorney, Agent, or Firm—Leonard Cooper

(57) ABSTRACT

Magnetic resonance force microscopy (MRFM) is a technology capable of detecting the magnetic resonance of a small number of spins and, potentially, a single spin of an electron or nucleus. Most methods use soft cantilevers with microscopic dimensions (microns) which have been developed for atomic force microscopy. Cantilevers have been both a solution and problem of high sensitivity force detection. They are difficult to fabricate and it is difficult to achieve the right sensitivity and stiffness with them. The proposed invention eliminates the cantilever and replaces it with small, magnetically sensitive objects called birdies, which are manipulated above a sample using electromagnetic field control. The basic principles of the cantilever-free MRFM are the same as those of traditional, cantilever-based systems. Motion of the birdie induced by magnetic resonance is monitored using optical interferometry. The magnetic resonance force microscope should have application in both material and biological research at the nanoscale level.

11 Claims, 6 Drawing Sheets

CANTILEVER-FREE MAGNETIC RESONANCE FORCE MICROSCOPE

This application claims the benefit of the U.S. provisional patent application No. 60/373,178 filed Apr. 17, 2002.

BACKGROUND OF THE INVENTION

Atomic force microscopy and its derivatives have become a very potent tool in the exploration of new materials and processes. Their use has become of critical importance for the semiconductor industry. A new technique has emerged which combines the power of atomic force microscopy and magnetic resonance. It is destined to have a tremendous impact on the science of metrology as did its older cousin, magnetic resonance imaging. This new technique is known as magnetic resonance force microscopy (MRFM).

Magnetic resonance force microscopy is a well-studied technology capable of detecting the magnetic resonance of a small number of spins and, potentially, a single spin of an electron or nucleus [1, 2, 3]. The method is a natural extension of atomic force microscopy whereby the deflection of an ultra sensitive cantilever is used to monitor minute pressure changes associated with magnetic resonance. The high sensitivity of these measurements is a result of the advances in nanotechnology and optical interferometry, which have led to spectacular results. Modem optical interferometry is capable of sub-angstrom deflection measurements, which now, in combination with ultra-sensitive cantilevers, make force measurements below $10^{-17}$ newtons per root Hz feasible.

In magnetic resonance force microscopy, a tiny, micron-sized spherical magnet is attached to the cantilever. Because of its small size the magnet produces astronomically large field gradients (up to 44000 T/m). In this high-gradient environment, magnetic resonance sets up a slight change of pressure between the magnet and the sample, and this pressure shows up in the cantilever deflection. The deflection can be enhanced by periodically exciting the resonance at a rate matching the resonance frequency of the cantilever.

The sensitivity of the force measurement is dependent on the properties of the cantilever: the softer the cantilever, the greater the force sensitivity. Great strides have been made in making ultra thin cantilevers having a low force constant [4]. The force on a cantilever is related to the deflection by the familiar formula $F=kx$, where F is the force, k is the spring constant, and x is the deflection. The force sensitivity (in meters/newton) is inversely proportional to the spring constant, so that a low force constant produces high sensitivity.

Soft cantilevers are difficult to manufacture. They tend to curl up and special materials are required to keep them stiff enough to remain straight. This is a difficult technology that only a few groups have mastered [4].

The cantilever serves several purposes.
1) It holds the magnet in place and allows it to be positioned.
2) It provides some horizontal/lateral x-y stability for the magnet
3) It provides a surface from which to reflect light for interferometer measurements.
4) It provides a mechanical resonator which enhances deflection.
5) It provides a linear force constant in the z-direction, allowing forces to be calibrated in the z-direction.

As cantilevers become thinner and thinner they become less relevant. Sidles and others have shown that it is best in some instances to couple the cantilever to a control coil and control system that can be manipulated to adjust the overall damping and resonance frequency. (Soft cantilevers may have too narrow a Q for practical applications). This requires active feedback from the interferometer to a torque control coil [5].

SUMMARY OF THE INVENTION

Another approach is to eliminate the cantilever entirely. This is the subject of the proposed invention. The cantilever is replaced with a field control substrate, forming a "virtual cantilever". All the features of a cantilever can be obtained using a "virtual cantilever". The virtual cantilever is comprised of "field springs" or potential wells set up by magnetic fields and/or electric fields. In this concept, the magnet or magnetization is levitated by electromagnetic fields above the surface of the sample. Attached to the magnet is a reflective surface for optically monitoring its height. This combination of magnet and reflective surface, which is herein named a birdie, floats freely above the sample and responds to the local forces. Since the birdie is free-standing and not mechanically bound to any cantilever arm, it has unprecedented force sensitivity. This is a key advantage when probing to detect magnetic resonance from a single electron or nucleus.

There are other advantages to cantilever-free operation. The fact that the birdie and its associated magnetic fields can be rotated or moved by command can potentially open up different magnetic resonance techniques. It may also be easier to fabricate and handle a field control substrate than an ultra-sensitive cantilever.

Levitation is not a revolutionary concept, but doing it at the nano-level is novel. The present inventor has much experience levitating magnetic objects at the macroscopic level using superconducting magnets and control coils. There are a variety of schemes available, including full active magnetic control, the inclusion of passive diamagnetic materials and superconductors (type I and type II), and even electrodes for electric field control. At this stage of development it is too early to define the optimal configuration required for levitation at the microscopic level. For purposes of illustration, a baseline approach is described using active magnetic field control. Other controls can be added later as required by the application.

The cantilever-free approach is a generalized approach and should have applications beyond MRFM in other force microscope instrumentation.

DESCRIPTION OF THE PREFERRED EMBODIMENTS OF THE INVENTION

Figure 1:
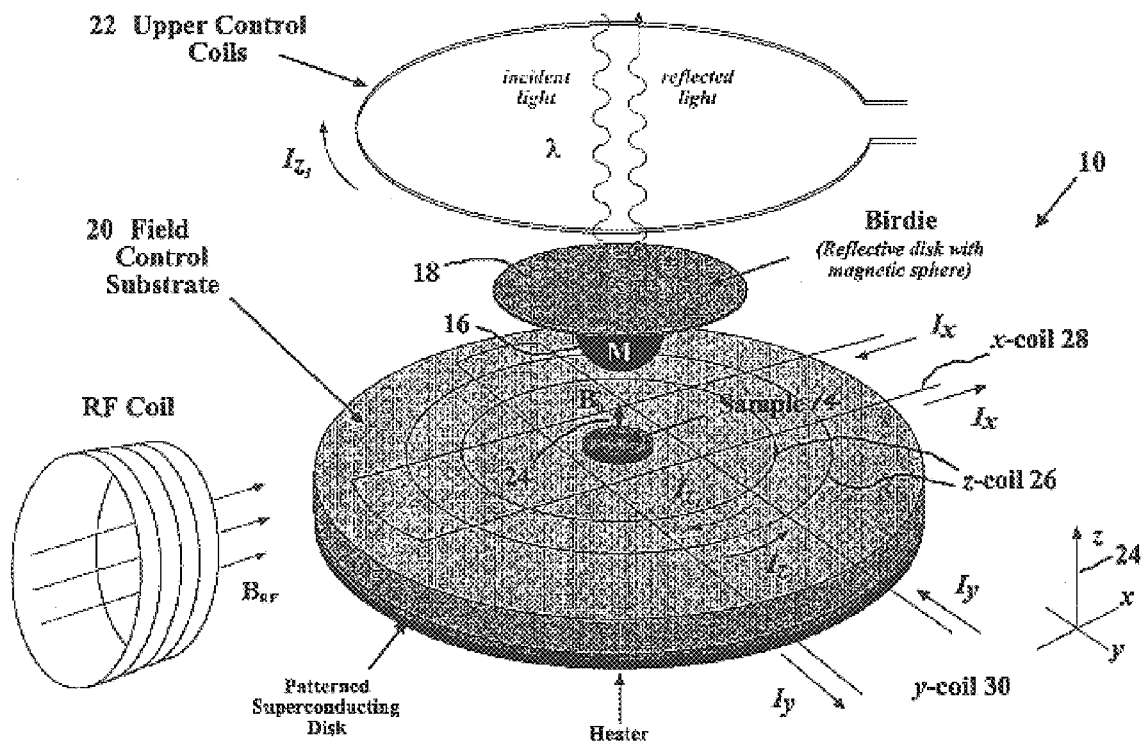
FIG. 1. The cantilever-free magnetic resonance force microscope (C-Free MRFM) in accordance with the invention. A magnetically active "birdie" is levitated in a magnetic "well" created by the field control substrate and the control coils. This makes the birdie extremely sensitive to forces induced by magnetic resonance. The birdie is attached to a reflector disk used for interferometric position and motion measurements. Superconducting components can be added to enhance the system's performance. The C-Free MRFM is capable of sensitivities significantly higher than those of conventional, cantilever-based systems. This makes the C-Free MRFM the best candidate for single-spin detection, first at the electron level, and ultimately at the nuclear level.
Figure 2:
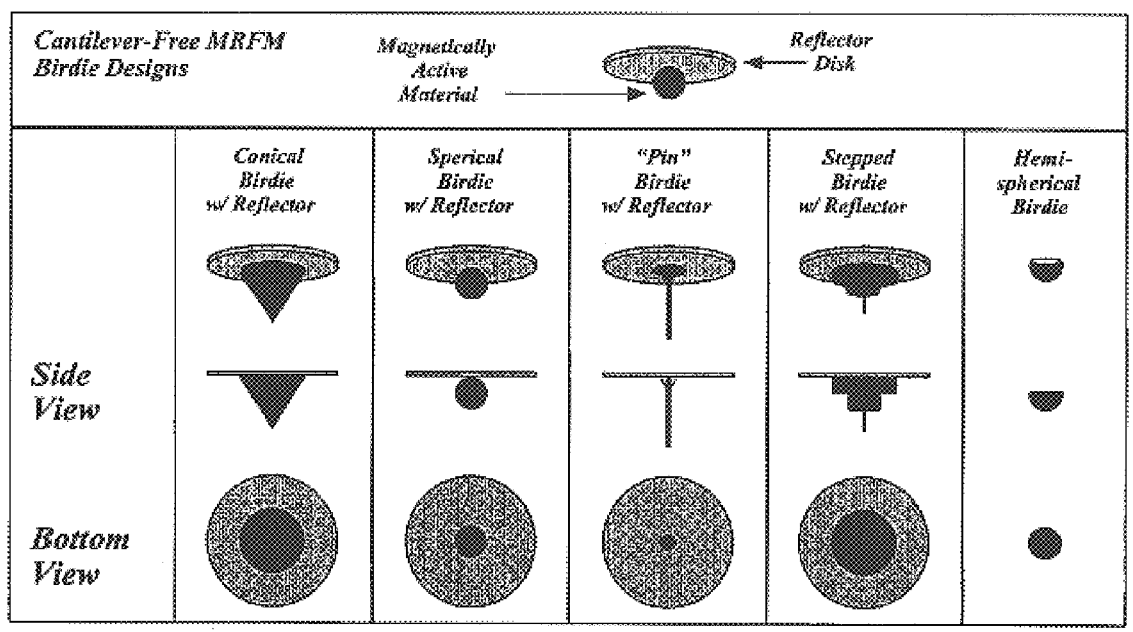
FIG. 2. Several concepts of the birdie design for use in FIG. 1. The optimal designs would be the conical or "pin" birdies, wherein the magnetically-active material (a magnetic or superconducting substance) culminates in a point giving rise to a large field gradient. The spherical or the stepped birdie designs may be the easiest to fabricate. In the first four examples, the birdie has a bonded reflector disk used for interferometric position and motion measurements. The hemispherical birdie utilizes the top, flat surface as a reflector.

FIG. 1 shows a cantilever-free system 10 using magnetic field control and a permanent magnet. The system consists of a levitated birdie 12 floating above a targeted sample 14. The birdie 12 includes a permanent, vertically magnetized magnet 16 attached to a reflective disk 18. The permanent magnet 16 can take on various geometric configurations, including a sphere, pyramid or conical structure, as shown in FIG. 2. The diameter of the sphere in the current example is 2 microns, but could be as smaller.

The sphere is suspended in a magnetic field produced by the control coils. As demonstrated by Earnshaw's theorem [9], a permanent magnet can not be held magnetically stable in three dimensions. It can be stable in two dimensions, but not in the third. For simplicity, it is assumed that the control substrate 20 (perhaps with the addition of upper control coils 22) produces a constant vertical field superimposed with a secondary, saddle-shaped magnetic field profile (not shown). This field configuration aligns the permanent magnet 16 and maintains stable equilibrium in a horizontal plane, but not in a vertical plane. Any torque on the magnet 16 would also be resisted by the imposed vertical alignment field. Along the vertical z axis extending from the sample 14, the permanent magnet is in unstable equilibrium, and is held in place by feedback. Current flowing through a Z gradient coil 26 moves the magnet back toward the center if it is thrown off-center by noise, magnetic resonance, or other perturbations.

Damping is accomplished using feedback, additional control coils, or by eddy current damping. The three major coils 26, 28, 30 in the control substrate 20 are shown in FIG. 1. These coils produce dB$_z$/dz, dB$_z$/dy and dB$_z$/dx linear gradients, which force the magnet to move in their respective directions. In this instance, because the magnetization is vertical, the forces are:

$$F_x = M\ dB_z/dx,\ F_y = M\ dB_z/dy,\ \text{and}\ F_z = M\ dB_z/dz$$

These coils provide z-stability and can be used to move the magnet 16 over a limited range in any direction to scan the sample 14. The control substrate 20 contains other coils (not shown) for increased stability or stiffness, and to compensate for magnetic field impurities and other, higher-order effects. It may be desirable to keep the coils below the substrate, but it may be more efficient to place them above the substrate, in the same plane or below the levitated magnetization, depending on the final design. Other coils could be included to rotate or spin the magnet about its axis (via eddy currents) for added stability as in the case of a levitron [8]. Passive or active superconducting materials may also be employed and are shown in the figure.

Electronic Subsystems

Figure 3:
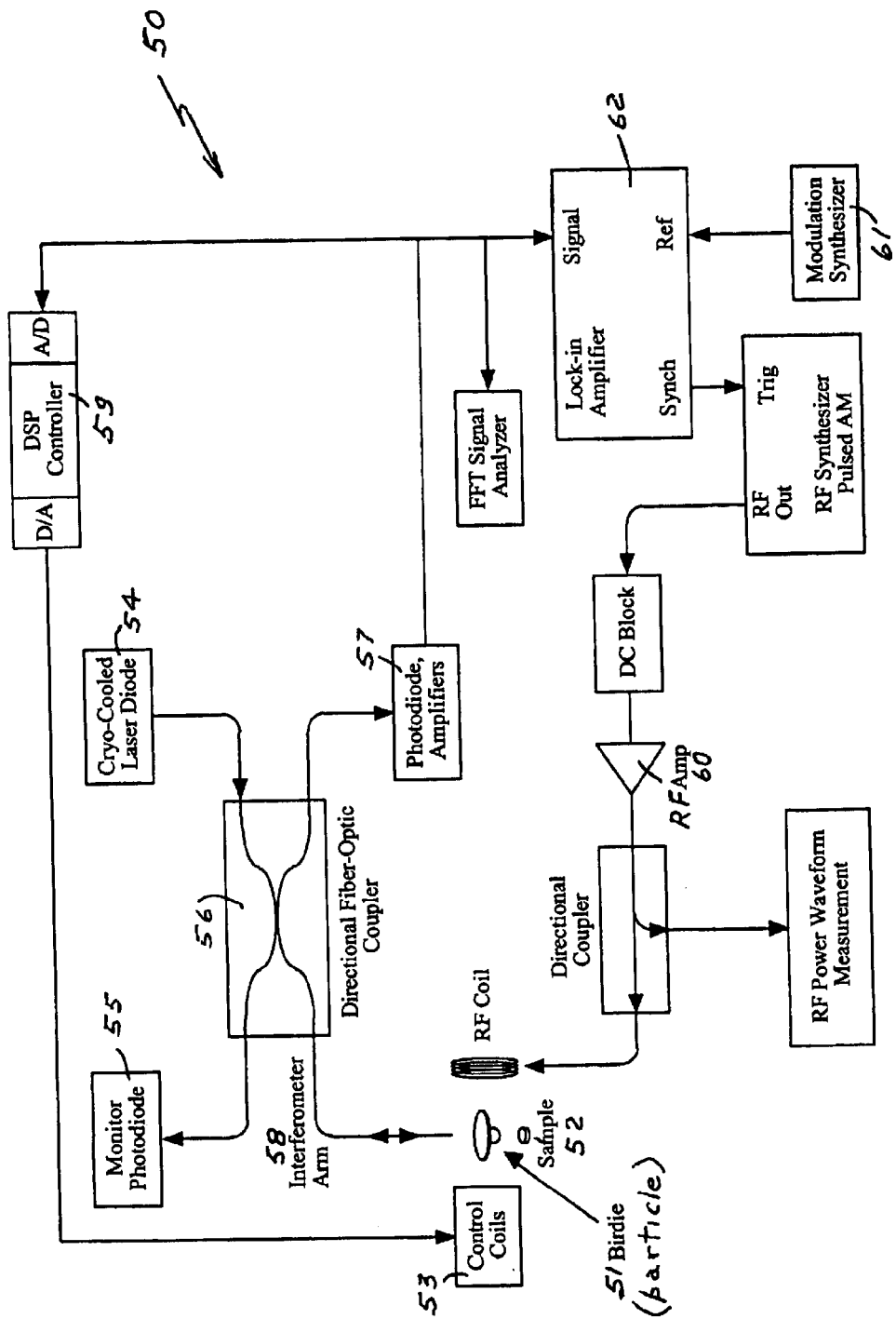
FIG. 3. The Electronic Control System (ECS) of the C-Free MRFM contains an optical interferometer section, an RF/microwave section and a DSP controller section. The RF will be operated at the magnetic resonance frequency which will be in the GHz range for electron spin resonance depending on the birdie magnetization.

In FIG. 3, most of the elements are shown of the electronics subsystem 50, which is similar to that used by Sidles. The birdie 51 is levitated just above the sample 52 via the control coils 53 (26,28,30) located in the control substrate 20 (see also FIG. 1). A laser diode 54 provides the light used to determine and monitor the birdie's exact position via interferometric measurements 55, 56, 57, 58. The height above the sample of the birdie is locked in by the DSP controller 59 using feedback from the interferometer measurements. For detecting magnetic resonance, the RF/microwave power amplifier 60 is cycled on and off at a rate determined by the frequency of the modulation synthesizer 61. The response of the birdie is detected using a lock-in amplifier 62 which has the same reference frequency as the microwave modulation. Obtaining resonance causes a pressure change that generates a vertical force on the birdie. The closed-loop gain of the DSP controller 59 and its associated filters determines the effective spring constant and damping of the birdie resonance. This closed-loop resonance can be made to coincide with the microwave modulation frequency for enhanced sensitivity, as in the case of a cantilever. One can also configure the system to be tightly locked to the birdie at a given height. In that case, one can monitor the fluctuation in the feedback control coil current in the control coils 53 and cross-correlate it with the modulation frequency, another valid detection scheme.

Birdie Manipulator

Figure 4:
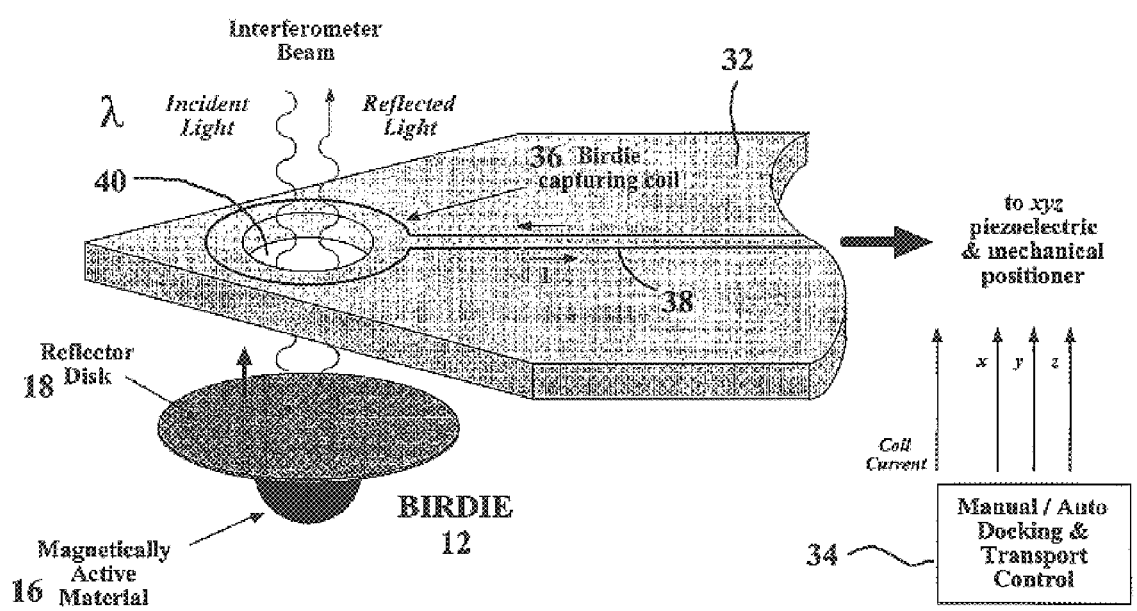
FIG. 4. The Birdie Manipulator moves the birdie into place in the microscope and positions it above the sample and control substrate. The birdie is lifted by a capturing coil located on an arm extending from a set of piezoelectric and mechanical actuators used for fine and coarse displacements, respectively. The arm also contains an aperture for monitoring the birdie.

In FIG. 4, a simplified conceptual design is shown, of a birdie manipulator subsystem used to move and position the birdie over the control substrate for levitation. A control arm 32 linked to a micro-mechanical actuator (not shown) is used to translate the birdie's x, y, and z positions. These motions are controlled both manually and automatically using a docking and transport control system 34. The arm 32 utilizes an electromagnetic coil 36 to lift and capture the birdie 12 via an adjustable capture control current 38. The manipulator also includes an aperture 40 for monitoring the birdie's position during manipulation. The manipulator also plays a major role in preparing the birdie for levitation. The birdie is released by turning off the capture coil current.

Control Subsystem

Figure 5:
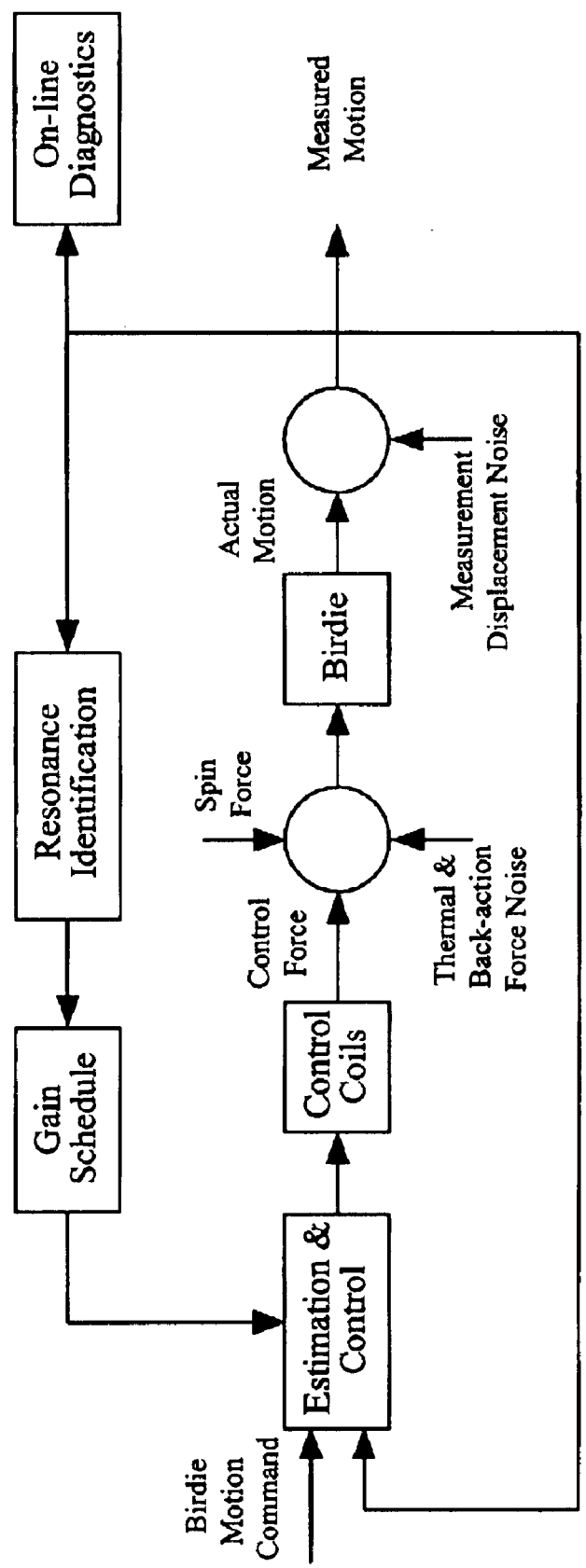
FIG. 5. The Control Subsystem consists of hardware and software for generating forces formed by slight adjustments to the currents flowing through the x, y, and z control coils shown in FIG. 1.

The major elements of the control system are illustrated in FIG. 5. The control subsystem consists of hardware and software for generating forces using slight adjustments to the currents flowing through the x, y, and z control coils 26, 28, 30 based on the birdie motion command and feedback. The control coils are contained in the field control substrate and are shown in FIG. 1. Sidles has reported on similar control systems and optimal control algorithms [6]. The same analysis can be applied to the cantilever-free situation. The goals are the same: (1) Obtain a favorable dynamic behavior. (2) Exact as little control force as possible. (3) Preserve the force SNR (Signal-to-Noise Ratio) of a free-floating birdie. (4) Control the birdie to track a motion reference, which is useful for sweeping fields for some MRFM techniques.

The inventor has had much experience with magnetic levitation on the macroscopic scale. These projects required high-precision control and utilized the persistent nature of superconducting magnets together with a set of one-sided control coils that allowed for the control of six degrees of freedom.

Figure 6:
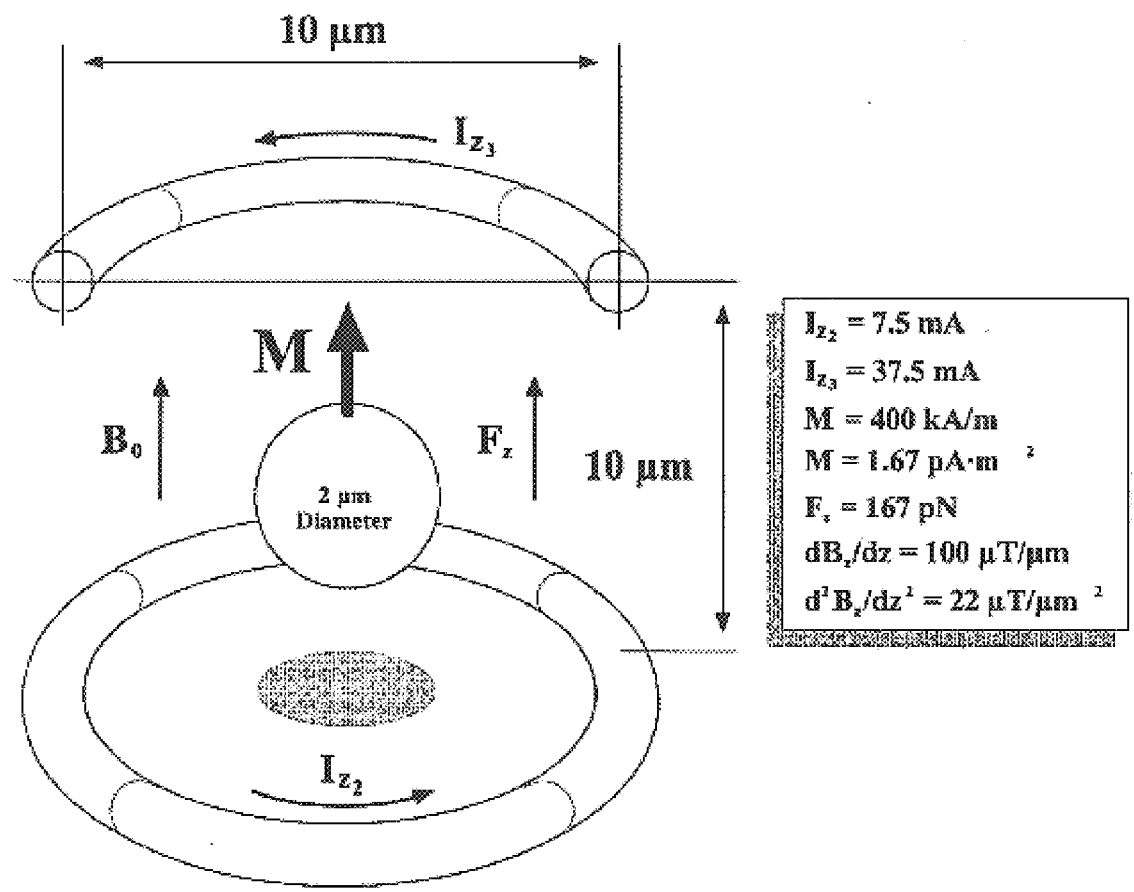
FIG. 6. Levitation of a 2-$\mu$m magnetically active sphere by a pair of control coils carrying opposing currents. The 167-pN force is generated by 7.5- and 37.5-mA currents in the upper and lower coils, respectively. The field gradient is 100 $\mu$T/$\mu$m, the magnetic moment of the sphere is 1.67 pA·m$^2$, and its magnetization is 400 kA/m. The sphere is a magnetic material such as samarium cobalt.

The MRFM application does not appear as demanding as macroscopic applications from a detailed controls aspect. Only one degree of freedom is of interest, the distance between the magnet and sample. The lateral motion may be constrained, passively. Small electromagnets and gradients can be constructed using conventional photolithography. The inventor has built MRI RF coils with 100-micron diameters. A simple two-coil z-control set shown in FIG. 6, is capable of producing a force of 100 piconewtons. This is the level of atomic force one encounters on the microscopic scale [5].

On the other hand, the microscopic universe is full of effects that one does not have to contend with on the macroscopic scale. Noise sources, static charges, snap-in forces close to the surface, etc., are expected to produce significant perturbations to levitation. Magnetic force control may be adequate, but one can also employ electric field control, diamagnetic materials, or superconducting materials to provide greater stability.

Type II superconductors are "flux trappers", and in that sense can act as magnets and magnet stabilizers. A type II superconductor placed under the permanent magnet birdie 16 can lead to a simple stable levitated state, but the spring constants and damping would not be as controllable as with pure electromagnetic coils. Diamagnetic materials can also be employed in the birdie. It is well known that diamagnets can be levitated in a magnetic field and can assist in stabilizing levitated permanent magnets [7]. In some situations, type I superconductors act as perfect diamagnets. They can also produce very high field gradients (almost as large as those of permanent magnets). Using a superconducting sphere as a diamagnet, one can adjust the strength of the diamagnetic field by adjusting the strength of the external applied field. This is an enabling feature for some magnetic resonance techniques.

Spin Physics

The spin physics required by the application is well established except as the scale of the experiment moves toward the single spin. The current literature has the simplest approach to demonstrate the detection [1]. Other methods have been proposed by Rugar which will work as well.

Noise Consideration

Rugar [4] has estimated the noise force power spectrum $S_F$ due to a cantilever stiffness k with a natural frequency $f_0$ and a quality factor Q and found it to be:

$$S_F = \left( \frac{2kk_B T}{\pi Q f_0} \right)$$

For a given field spring constant and system damping, the same noise analysis can be applied as with a cantilever. The difference is that the stiffness and quality factor Q, and hence the noise floor of the system are completely controllable in the cantilever-free concept. This situation is similar to that described by Sidles [6] in that the closed loop performance is not intrinsic to a given cantilever design, but is defined more precisely by the control system parameters. The ultimate SNR and force sensitivity may be a practical tradeoff between desired levitational stability and acceptable noise floor. The cantilever-free approach represents the most sensitive and flexible technique possible for force detection.

Low Temperatures and Cryogenics

Cryogenics is required to reduce the noise floor of the system. Liquid nitrogen temperatures and liquid helium temperatures are the most useful. Liquid helium is the preferred cryogen because type I superconductors can be used at those temperatures.

Control System

As mentioned before, the control system can be based on previously known optimum control theories described by Sidles [6]. The cantilever-free MRFM approach allows for the control of more parameters than available in the conventional approach.

Microspheres of magnetic and superconductive material generate magnetization and magnetic field gradients. Two classes of materials are of interest, including magnetic materials (SmCo, iron, nickel, ferrites, etc.) and superconductors (Pb, Nb, NbTi, MgB2, etc.). The magnet material will be isolated, processed and magnetized separately. Superconductors are cooled at cryogenic temperatures as part of the levitation process, trapping flux and/or forming diamagnetic currents.

Perfect spheres are not necessarily required. Other valid shapes include cones or pyramid structures, even small stacked cylinders which may be capable of producing large field gradients, as shown in FIG. 2.

Techniques for Fabricating "Birdies"

Birdies are essentially microspheres to which a reflective coating or surface may be formed for optical monitoring. The birdies are levitated over the sample using a set of control coils and magnetic hardware. Laser light is reflected off the birdie and used to evaluate the height position.

One promising technique for forming birdies is to micromachine microspheres into hemispheres. The flat part of the hemisphere forms the reflective surface. Another technique is to bond an ultra thin disk of aluminum to the sphere, or coat the sphere with a reflector material.

Birdie Manipulators.

Birdie manipulators are miniature devices capable of docking and transporting a single birdie to a targeted sample. A conceptual design of the birdie manipulator is shown in FIG. 4 wherein a tiny electromagnetic coil is placed at the tip of a small arm interfaced to a micro-positioner. The birdie manipulator system includes provisions for launching the birdie which minimizes or eliminates the interruption to the interferometer Control Substrate.

The control substrate consists of a platform of control coils and possibly superconducting material or other materials used to stabilize the birdie over a target sample area. For simplicity, the target sample area could be and integral part of the control structure. In some circumstances it may be desirable if the sample area is distinct and separate from the control substrate.

The control substrate may be a silicon wafer with multilayers (possibly ten layers) of coils and lines of conductors (and/or superconductors) which form magnetic fields used in stabilizing the birdie.

Optical Microscope/Interferometer Platform

An optical microscope/interferometer platform serves as a valid test bed. The in-plane resolution of the optical microscope is limited to 200 nm but allows for x-y stability observations and for z-control. Using interferometry, one can bring the vertical resolution down to angstrom or sub-angstrom levels. The microscope allows for x-y stability observations and for z-control.

References

1. W. M. Dougherty, et al., "The Bloch equations in high-gradient magnetic resonance force microscopy: Theory and experiment", *J. Mag. Res.* 143, 106–119 (2000)
2. D. Rugar, C. S. Yannoni, and J. A. Sidles, "Mechanical detection of magnetic resonance", *Nature*, 360 (6404), 563–566 (1992)
3. J. A. Sidles, et al., "Magnetic force microscopy", *Reviews of Modern Physics*, 67 (1), 249–265 (1995)
4. T. D. Stowe et al., "Attonewton force detection using ultrathin silicon cantilevers", *Appl. Phys. Lett.* 71 (2), 288–290 (1997)
5. G. Binnig, C. F. Quate, and C. Gerber, "Atomic force microscope", *Physics Review Letters*, 56 (9), 930–933 (1986)
6. K. J. Bruland, et al., "Optimal control of ultrasoft cantilevers for force microscopy", *J. Appl. Phys.*, 83 (8), 3972–3977 (1998)
7. M. Berry and A. Geim, *Eur. J Phys.*, 18 307
8. M. Berry, *Proc. R. Soc.*, A452, 1 207
9. S. Earnshaw, "On the nature of the molecular forces which regulate the constitution of the luminferous ether", *Trans. Camb. Phil. Soc.*, 7, pp 97–112 (1842)
10. Hennessy, M. J.; Woods, R. T.; Zou, H. B.; Wilcox, R. E. and F. S. Murray. Large Gap Magnetic Suspension System with Superconducting Coils. (U.S. Pat. No. 5,332,987)

What is claimed is:

1. A cantilever-free magnetic resonance force microscope comprising:

a magnetically active particle at a first position for producing a magnetic field gradient on a sample to be observed, said particle having mutually orthogonal X, Y, Z axes and being spaced away from said sample along said Z axis, said sample interacting with said field gradient to produce forces acting between said particle and sample;

electromagnetic means creating magnetic fields for suspending said particle without mechanical support at said first position;

detection means for outputting first detection signals corresponding in magnitude to magnitudes of displacement of said particle from said first position;

processing means for receiving said first detection signals and converting said first detection signals to control signals, said control signals being input to said magnetic means for suspending said particle to modify said magnetic fields, said particle being returned toward said first position by said electromagnetic means;

means for interacting with said sample to change said forces between said sample and said particle and thereby to cause instantaneous displacement of said particle along said Z axis, one said detection signal corresponding to Z-direction displacement of said particle indicating changes of said forces in said Z-direction.

2. A microscope as in claim 1, wherein said particle includes one of a permanent magnetic material and a superconductor.

3. A microscope as in claim 2, wherein said particle has a shape that is one of spherical, conical, rod-shaped, and needle-shaped.

4. A microscope as in claim 1, wherein said electromagnetic means provide positional control, levitation stability, and a potential well with a motional stiffness.

5. A microscope as in claim 4, wherein said particle includes a reflective surface, said detection means including electro-optics for tracking said displacement of said particle.

6. A microscope as in claim 5, wherein said means for interacting with said sample includes an RF field for exciting magnetic resonance, said electromagnetic means includes means for generating a static magnetic field for magnetic resonance and means including RF pulsed electronic circuits and synchronous detection for detecting magnetic resonance in said sample.

7. A microscope as in claim 4, wherein said electromagnetic means includes coils having currents to generate electromagnetic fields for positioning and releasing said permanent magnet in said potential well at said first position.

8. A microscope as in claim 4, wherein said electromagnetic means includes positioners for control of position of said permanent magnet prior to said releasing.

9. A microscope as in claim 4, wherein said detection means sense current fluctuations in said electromagnetic means due to particle movement relative to said sample, said processing means acting on said control signals to maintain a substantially fixed position of said particle relative to said sample.

10. A microscope as in claim 1, wherein said electromagnetic means includes at least one of coils having current to generate magnetic fields and gradients, voltage activated electrodes generating electric fields and field gradients, passive magnetic and superconducting materials for shaping the fields whereby position, levitation and shape and stiffness of a potential well are electrically controlled.

11. A microscope as in claim 10, wherein said processing means uses said detection signals in active feedback to adjust voltages and currents to said coils and electrodes.

* * * * *